United States Patent [19]

Kitajima et al.

[11] Patent Number: 4,719,457
[45] Date of Patent: Jan. 12, 1988

[54] INFORMATION INPUT/OUTPUT DISPLAY DEVICE

[75] Inventors: Masaaki Kitajima; Masahiro Takasaka, both of Hitachiohta; Yoshiharu Nagae, Hitachi, all of Japan

[73] Assignee: Hitachi, Ltd., Tokyo, Japan

[21] Appl. No.: 702,225

[22] Filed: Feb. 15, 1985

[30] Foreign Application Priority Data

Feb. 22, 1984 [JP] Japan .................. 59-30259

[51] Int. Cl.$^4$ .............................................. G09G 3/36
[52] U.S. Cl. ........................................ 340/784; 340/713; 350/331 T; 350/351
[58] Field of Search ............... 340/707, 713, 714, 784, 340/365 C, 712, 711; 350/331 R, 331 T, 351

[56] References Cited

U.S. PATENT DOCUMENTS

| | | | |
|---|---|---|---|
| 4,224,615 | 9/1980 | Perz | 340/712 |
| 4,391,492 | 7/1983 | Lu et al. | 340/713 X |
| 4,405,917 | 9/1983 | Chai | 340/365 C |
| 4,412,209 | 10/1983 | Frame et al. | 340/365 C |
| 4,425,027 | 1/1984 | Portmann | 340/713 X |
| 4,442,317 | 4/1984 | Jandrell | 340/712 X |
| 4,499,458 | 2/1985 | LeBere et al. | 340/713 |
| 4,500,878 | 2/1985 | Hareng et al. | 340/713 |
| 4,520,357 | 5/1985 | Castleberry et al. | 340/712 X |
| 4,525,708 | 6/1985 | Hareng et al. | 340/713 |
| 4,529,968 | 7/1985 | Hilsum et al. | 340/365 C |

OTHER PUBLICATIONS

*IBM Technical Disc. Bul.*, vol. 12, No. 8, Jan. 1970, "Capacitive Touch Key Circuit", D. M. Taub.
*IBM Tech. Disc. Bul.*, vol. 25, No. 8, Jan. 1983, "Dynamically Adjustable Capacitive Key Sensing Method", J. G. Irwin, Jr.
*IBM Tech. Disc. Bul.*, vol. 27, No. 4A, Sep. 1984, "Dynamic Updating of Key-Sensing Thresholds", J. T. Rowe, Jr.

*Primary Examiner*—Gerald L. Brigance
*Attorney, Agent, or Firm*—Antonelli, Terry & Wands

[57] ABSTRACT

An information input/output display device comprising a dielectric which is held in a portion between one electrode and the other electrode opposite to each other and which has at least a first state and a second state of unequal capacitances, means to change the capacitance of the dielectric, capacitance holding means to hold at least temporarily a value of the capacitance of the dielectric in the first state, and means to compare the value of the capacitance of the dielectric with the value of the capacitance held by the capacitance holding means, whereby information can be read out without being affected by fluctuations in a distance d between the electrodes or/and in an ambient temperature T.

16 Claims, 25 Drawing Figures

INFORMATION INPUT/OUTPUT DISPLAY DEVICE

BACKGROUND OF THE INVENTION

The present invention relates to an information input/output display device having information input and output capabilities, and more particularly to an information input/output display device which can deliver written information to an external device.

Hereinbelow, a liquid crystal device furnished with a display function and an information holding function will be exemplified and explained as an information input/output display device.

Heretofore, as an information input/output display device, there has been known a device which is made from a smectic liquid crystal or a ferroelectric substance, such as PLZT, possessing a display function and an information holding function.

For example, the liquid crystal devices known exploit various display principles based on nematic liquid crystals, cholesteric liquid crystals or smectic liquid crystals. Any of the devices displays information in such a way that the oriented state of liquid crystal molecules is changed by an external field such as an electric field, and that the resulting change of an optical property is utilized.

On the other hand, as methods for reading out information displayed on a display member to an external circuit, there has been proposed a system wherein the information is read out by detecting the change of a capacitance based on an external field such as an electric field as disclosed in U.S. patent application Ser. No. 521900 (corresponding to European Patent Application No. 83107895.1).

By way of example, a method for reading out information proposed in a paper "Light Pen and Readout Functions in Thermally Addressed Smectic Liquid Crystal Display" (Y. Nagae, et al, Japan Display '83, pp. 490–493) will be briefly explained (European Patent Applications Nos. 84101914.4 and 84105941.3).

FIG. 1 shows a plan view of a liquid crystal matrix panel. The liquid crystal matrix panel 1 is such that the interspaces between X electrodes $2a$–$2c$ and Y electrodes $3a$–$3c$ are filled up with a smectic liquid crystal (A phase).

Each part where the X electrode and the Y electrode intersect forms a picture element 4, the capacitance of which becomes $C_o = \epsilon_o \cdot \epsilon_s / d \cdot S$. In the preceding expression, $\epsilon_o$=free space permittivity, $\epsilon_s$=relative permittivity of the liquid crystal layer, d=distance between the X and Y electrodes, and S=area of the picture element.

Now, when a voltage $V_s$ whose voltage rise rate (dV/dt) is constant is applied to the Y electrode $3a$, currents $i_s$ as shown in FIGS. 2(a) and 2(b) flow out from the X electrodes. Since, on this occasion, the saturation value of the current $i_s$ becomes $$I_{s(sat)} = C_o \cdot \frac{dV}{dt},$$

information written in the liquid crystal matrix panel can be read out by discriminating the magnitude of the saturation value. This purpose can be achieved by connecting current-to-voltage converter circuits 5 to the X electrodes $2a$–$2c$ and comparing the output voltages of these circuits with a reference voltage $V_{ref}$.

The aforementioned capacitance $C_o$ depends upon the distance d between the X and Y electrodes. On account of this fact, the disperson of d enlarges especially in a larger-sized panel, resulting in the large dispersion of the capacitance $C_o$. Further, since the relative permittivity of the smectic liquid crystal fluctuates depending upon temperatures, the capacitance $C_o$ fluctuates depending also upon the temperatures.

With the prior-art method, therefore, errors occur in the read-out of information, making it difficult to construct a device of high reliability.

SUMMARY OF THE INVENTION

An object of the present invention is to eliminate the disadvantage described above, and to provide an information input/output display device which can read out information without being affected by the dispersion of the inter-electrode distance d and the fluctuation of the ambient temperature T.

The first characterizing feature of the present invention for accomplishing the object consists in providing a dielectric which is held in a portion between one electrode and the other electrode opposite to each other and which has at least a first state and a second state of unequal capacitances, means to change the capacitance of said dielectric, means to detect the capacitance of said dielectric, capacitance holding means to hold at least temporarily a value of the capacitance of said dielectric in the first state, and means to compare the value of the capacitance of said dielectric with the value of the capacitance held by said capacitance holding means.

The second characterizing feature of the present invention consists in provision of a dielectric which is held in portions between a plurality of electrodes on one side and a plurality of electrodes on the other side opposite to one another, with the opposite portions forming a matrix of M rows and N columns as a whole, and which has at least a first state and a second state of unequal capacitances, means to change the capacitance of said electric in any desired one of the opposite portions, means to detect the capacitance of said dielectric in the desired opposite portion, capacitance holding means to divide the matrix of M rows and N columns into k ($1 \leq k < M \times N$) blocks and to hold at least temporarily a value of the capacitance of said dielectric in the first state held in any desired one of the opposite portions included in said each block, and means to compare the value of the capacitance of said dielectric in the desired opposite portion with the value of the capacitance held by said capacitance holding means corresponding to the block of said dielectric in said desired opposite portion.

Here, the expression "dielectric" signifies a dielectric the capacitance of which is changed by applying an electric field, heat or the like thereto and is retained without changing for a fixed period of time even after removing the electric field, the heat or the like therefrom. Mentioned as examples are a liquid crystal having a smectic phase, a liquid crystal having a cholesteric phase, and PLZT. It is preferable to use the liquid crystal having the smectic phase into which information can be written at a comparatively low temperature and with a comparatively low voltage and the storage time of which is long.

The other objects and features of the present invention will become apparent from the following description of embodiments.

DETAILED DESCRIPTION OF THE EMBODIMENTS

Now, the present invention will be described in detail by taking a liquid crystal having a smectic phase as an example.

Figure 1:
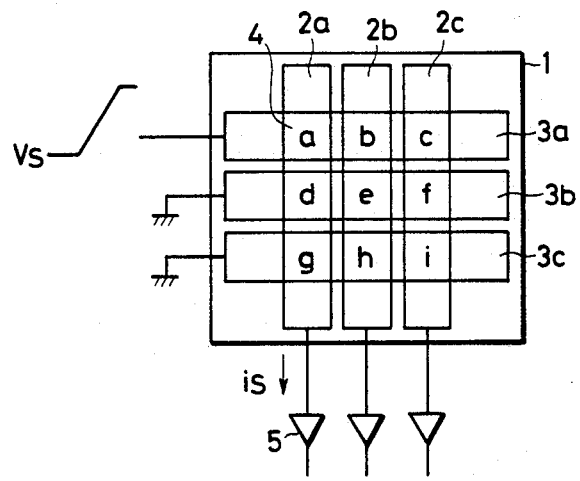
FIG. 1 and FIGS. 2(a)–2(b) are diagrams showing a prior-art method of reading out image information.
Figure 2A:
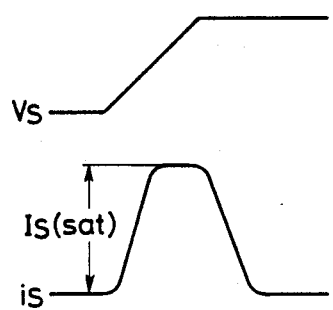
Figure 2B:
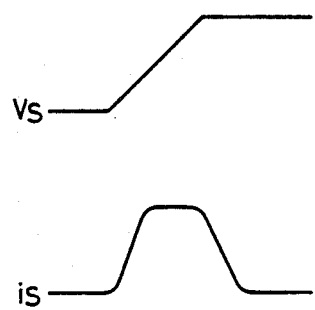
Figure 3:
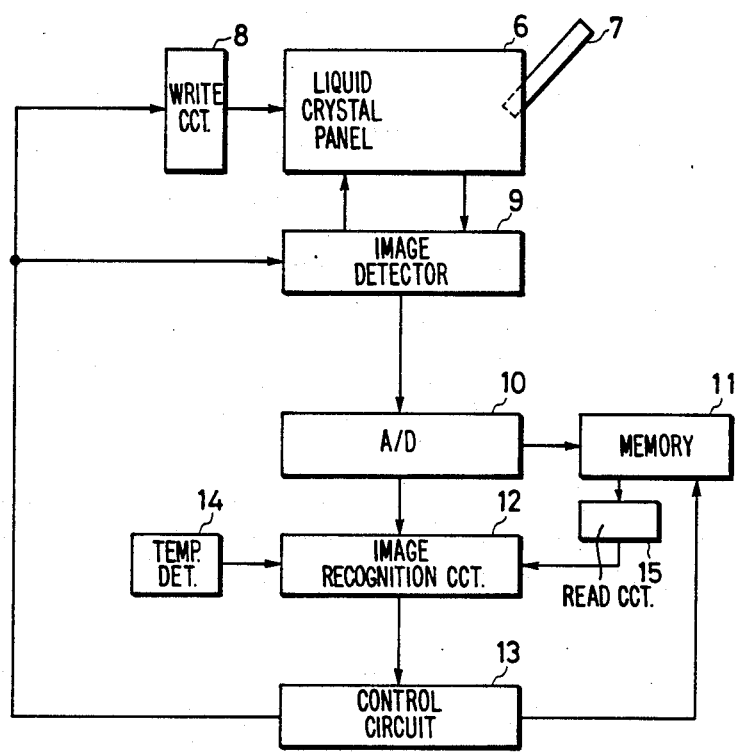
FIG. 3 is a diagram of the whole arrangement of an embodiment of the present invention.

FIG. 3 shows a diagram of the whole arrangement of an information input/output display apparatus according to an embodiment of the present invention. A light pen 7 and image information writing means 8 constitute means for changing the capacitance of that liquid crystal having the smectic phase which serves as a dielectric in the portion between one electrode and the other electrode of a substrate opposite to each other, thereby to write image information such as characters and symbols into a liquid crystal panel 6.

The material of the liquid crystal to be used is a mixture which consists of substances generally represented by, for example,

(where R denotes an alkyl group), which exhibits a positive dielectric anisotropy, which presents a smectic A phase at the room temperature, and which undergoes a transition from the smectic phase to a nematic phase at 42° C. and further from the nematic phase to an isotropic liquid phase at 45° C.

As other liquid crystals presenting the smectic A phase, there are mentioned a mixture consisting of 4,4'-alkoxybiphenyl alkylcarbonate ester and 4,4'-alkylcyanotran, a mixture consisting of 4-alkoxyphenyl-4'-alkylbenzoate ester and P,P'-alkylcyanobiphenyl, etc.

When a dichromatic pigment is added to the aforementioned liquid crystal, the visual angle characteristic of display is enhanced, and this is favorable for a display device.

The image information written in the liquid crystal panel 6 is read out by image information detection means 9 to detect a capacitance by applying a voltage changing with time to one opposite electrode and then detecting current flowing through the other opposite electrode. The information read out is sent to an analog-to-digital converter circuit 10, the output of which is fed into a memory circuit 11.

The memory circuit 11 temporarily holds the output of the analog-to-digital converter circuit 10 before the writing of the image information into the liquid crystal panel 6.

An image information recognition circuit 12 compares the content stored in the memory circuit 11 beforehand, with image information read out anew as well as temperature information detected by temperature detection means, 14 so as to discriminate the image information written in the liquid crystal panel 6.

A control circuit 13 controls the various circuits mentioned above.

Next, the arrangements and operations of the respective portions will be described in detail.

The inventors have proposed the image information writing means 8 and the image information detection means 9 shown in FIG. 3 (European Patent Applications Nos. 84101914.4 and 84105941.3).

Therefore, the image information writing means 8 and the image information detection means 9 will be briefly explained with reference to FIGS. 4 to 7(c).

Figure 4:
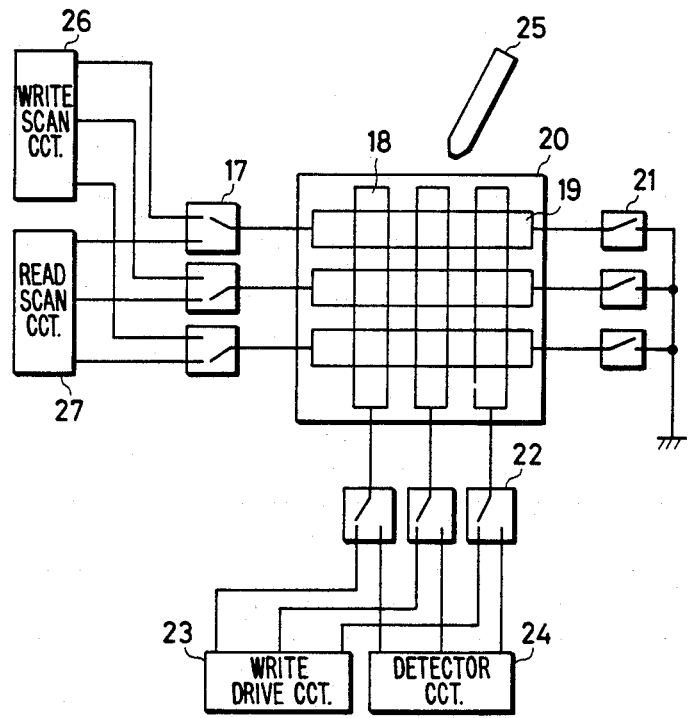
FIG. 4 to FIGS. 7(a)–7(c) are schematic diagrams of the writing and reading of image information.

FIG. 4 shows the outlines of the image information writing means 8 and the image information detection means 9. A liquid crystal panel 20 is constructed of a pair of substrates which are formed in such a manner that three scanning electrodes 19 and three signal electrodes 18 oppose at their opposite surfaces and that the opposite portions of the scanning electrode 19 and the signal electrodes 18 constitute a matrix of 3 rows and 3 columns as a whole. A group of switches 17 and a group of switches 21 are connected to the scanning electrodes 19 of the liquid crystal panel 20. An image information writing scanning circuit 26 is connected to the terminals of the switches 17 on one side, while an image information reading scanning circuit 27 is connected to the terminals thereof on the other side.

Meanwhile, a group of switches 22 are connected to the signal electrodes 18, the terminals of which on one side have a writing drive voltage generator circuit 23 connected thereto and the terminals of which on the other side have an image information detector circuit 24 connected thereto.

A light pen 25 is made of, for example, an infrared semiconductor laser.

In writing image information into the liquid crystal panel 20, the image information writing scanner circuit 26 is selected by the switches 17, and further, the writing drive voltage generator circuit 23 is selected by the switches 22.

On the other hand, in reading image information out of the liquid crystal panel 20, the image information reading scanner circuit 27 is selected by the switches 17, and further, the image information detector circuit 24 is selected by the switches 22.

Here, the basic operations of reading out image information, which form the principal object of the present invention, are illustrated in FIGS. 5 to 7(c).

Figure 5:
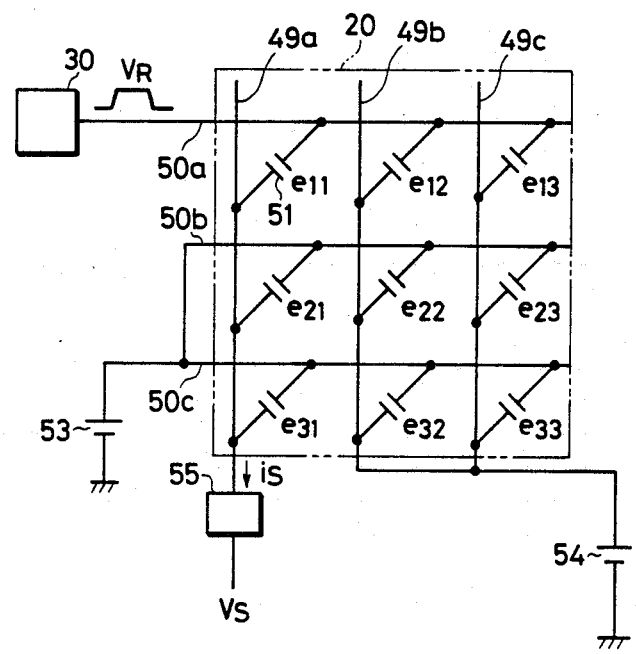

Referring to FIG. 5, in reading out the information of a picture element $e_{11}$ by way of example, a reading voltage $V_R$ is applied to a scanning electrode 50a, and current $i_S$ flowing through a signal electrode 49a at this time is detected by a current detector circuit 55. Scanning electrodes 50b, 50c and signal electrodes 49b, 49c are respectively connected to D.C. power sources 53 and 54, or they are grounded.

As stated before, the liquid crystal having the smectic phase for use in the present embodiment exhibits the positive dielectric anisotropy. That is, the relation between the relative permittivity $\epsilon_\parallel$ in the major axis direction of liquid crystal molecules and the relative permittivity $\epsilon_\perp$ in the minor axis direction is $\epsilon_\parallel > \epsilon_\perp$.

Accordingly, in the non-written state in which information is not written, the liquid crystal molecules are oriented perpendicularly to the electrodes, and the relative permittivity of the liquid crystal layer is substantially equal to the relative permittivity $\epsilon_\parallel$ in the major axis direction of the liquid crystal molecules.

In the written state in which information is written, the orientation directions of the liquid crystal molecules are in conspicuous disorder. Assuming that the orientation directions be perfectly random, the relative permittivity $\epsilon_S$ of the liquid crystal layer becomes close to the three-dimensional average value $\frac{1}{3}(\epsilon_\parallel + 2\epsilon_\perp)$ of $\epsilon_\parallel$ and the relative permittivity $\epsilon_\perp$ in the minor axis direction of the liquid crystal molecules, the average value being smaller than $\epsilon_\parallel$.

Herein, since each picture element is such that the interspace between the electrodes is filled with the liquid crystal layer being the dielectric, the capacitance thereof differs owing to the unequal permittivities caused by the fact that the molecular orientations in the written state and the non-written state are different as described above.

Accordingly, the capacitance $C_W$ of a picture element in the written state and the capacitance $C_{NW}$ of a picture element in the non-written state are different. In the case as above described where the liquid crystal material having the positive dielectric anisotropy, for example, is employed to vertically orient the liquid crystal molecules in the non-written state, $C_W < C_{NW}$ holds, and the ratio becomes:

$$\frac{C_{NW}}{C_W} = \frac{\epsilon_\parallel}{\frac{1}{3}(\epsilon_\parallel + 2\epsilon)} > 1 \tag{1}$$

The inventors measured the capacitances by the use of a liquid crystal having $\epsilon_\parallel = 12$ and $\epsilon_\perp = 4.7$. As a result, it has been confirmed that $C_{NW}/C_W = 1.48$ holds which is close to a value 1.68 calculated with Eq. (1).

Besides, in a case where the liquid crystal material having the positive dielectric anisotropy is employed and where the initial orientation is a horizontal orientation, $C_W > C_{NW}$ holds.

Figure 6A:
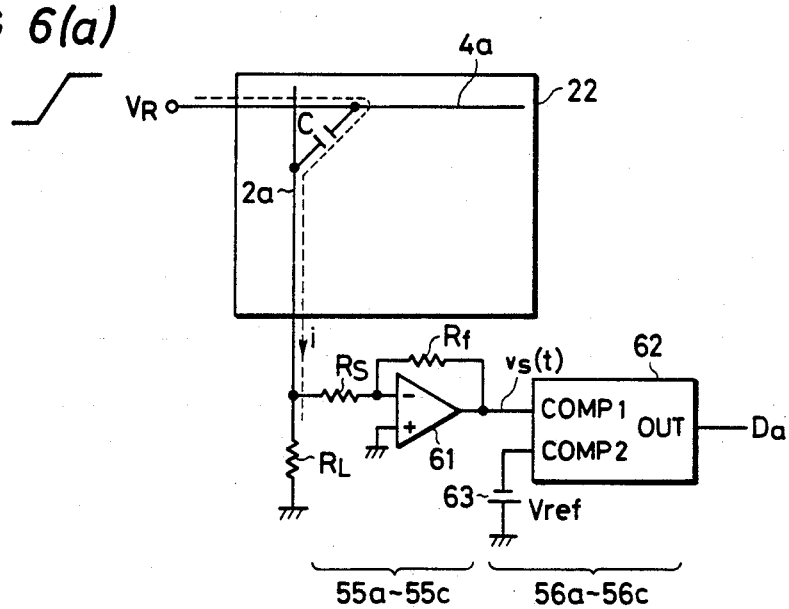
Figure 6B:
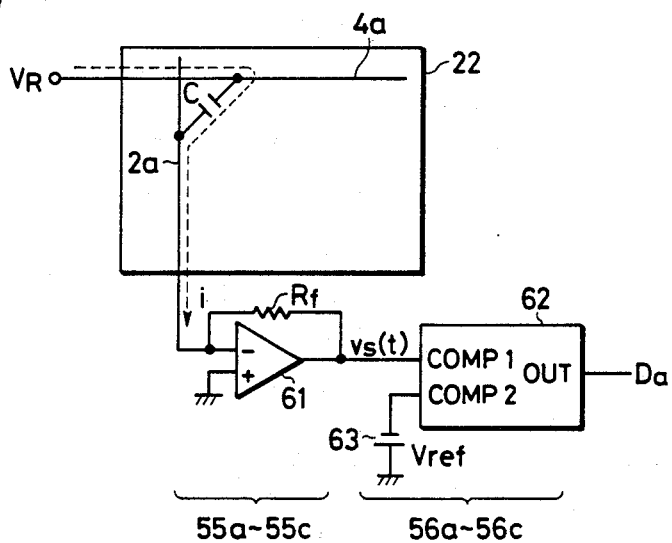

FIGS. 6(a) and 6(b) show practicable examples of current detector circuits 55a-55c and capacitance discriminator circuits 56a-56c, which form the image information detector circuit 24. Further, FIGS. 7(a)-7(c) serve to explain voltage waveforms at various parts in FIGS. 6(a) and 6(b).

Referring to FIG. 6(a) or 6(b), when a picture element is regarded as a capacitance C and a reading voltage $V_R$ is applied to an electrode 4a, a displacement current $i_s(t)$ flows through an electrode 2a.

Figure 7A:
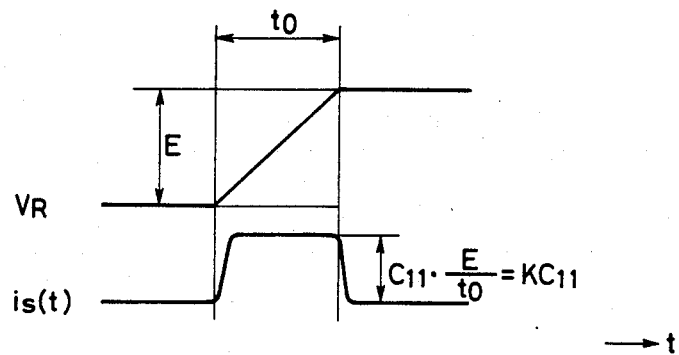
Figure 7B:
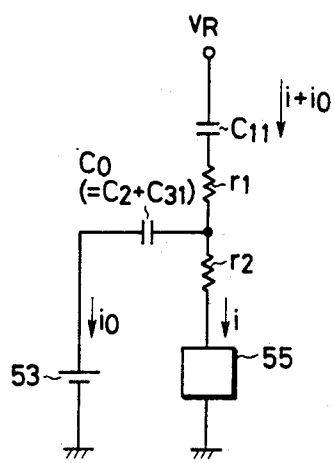
Figure 7C:
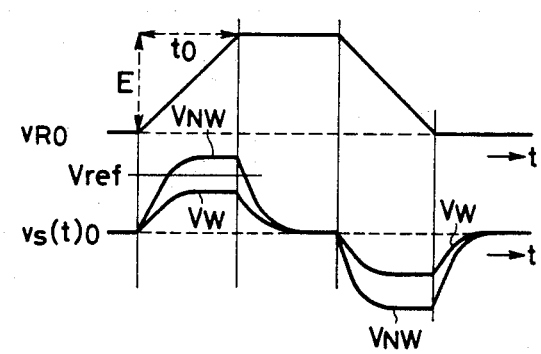

FIGS. 7(a)-7(c) show a situation in the case of reading out the capacitance of a picture element $e_{11}$. Here, the capacitances of picture elements $e_{11}$, $e_{21}$ and $e_{31}$ are respectively denoted by $C_{11}$, $C_{21}$ and $C_{31}$.

By way of example, when the reading voltage $V_R$ is a ramp voltage of $$\frac{dV}{dt} = \frac{E}{t_o} = K$$

as shown in FIG. 7(a) and wiring resistances $r_1$ and $r_2$ are assumed to be sufficiently small, the displacement current i flowing to the current detector circuit 55 becomes saturated to a value $K \cdot C_{11}$ in a short time.

Now, assuming $C_o = C_{21} + C_{31}$ in FIG. 7(b), $$\begin{cases} \frac{1}{C_{11}} \int (i + i_o) dt + r_1(i + i_o) + r_2 i = Kt & (2) \\ \frac{i}{r_2} = \frac{1}{C_o} \int i_o dt & (3) \end{cases}$$

hold. The displacement current $i_s(t)$ is obtained by the Laplace transform etc. from Eqs. (2) and (3), as follows:

$$i_s(t) = K \cdot C_{11} \left( 1 - \frac{\beta e^{\alpha t} - \alpha e^{\beta t}}{\beta - \alpha} \right) \tag{4}$$

Here, assuming the following:

$$A = r_1 r_2 C_o \text{ and } B = r_1 + r_2 + \frac{r_2 C_o}{C_{11}}$$

then the following equations hold:

$$\alpha = \frac{-\frac{B}{A} + \sqrt{\left(\frac{B}{A}\right)^2 - \left(\frac{4}{C_{11} A}\right)}}{2} < 0 \tag{5}$$

$$\beta = \frac{-\frac{B}{A} - \sqrt{\left(\frac{B}{A}\right)^2 - \left(\frac{4}{C_{11} A}\right)}}{2} < 0 \tag{6}$$

From Eq. (4), $i_s(t=0) = 0$ and $i_s(t=\infty) = K \cdot C_{11}$ hold. It is understood that the displacement current $i_s(t)$ at the saturation becomes $K \cdot C_{11}$, which does not depend upon the wiring resistances $r_1$ and $r_2$ of the other capacitance $C_o (= C_{21} + C_{31})$ electrode and which is not affected by current attributed to crosstalk.

Accordingly, the detection of the capacitance $C_W$ of the picture element in the written state and the capacitance $C_{NW}$ of the picture element in the non-written state is permitted by detecting the displacement current $i_s(t)$ as illustrated in FIG. 7(a), and image information can be read out in a short time.

The read-out of image information may well be performed by detecting the displacement current $i_s(t)$ in a transient state. However, it enhances the detection accuracy more to detect the displacement current $i_s(t)$ after it has been saturated and stabilized as illustrated in FIG. 7(a).

Further, the detection of the displacement current $i_s(t)$ may be performed either at the rise or at the fall of the reading voltage $V_R$.

Regarding the "reading voltage $V_R$ changing with time", the capacitance can be detected even when a voltage other than the voltage whose dV/dt is constant (=K), for example, a sinusoidal voltage is used. As understood from Eq. (4), however, the detection is easier when dV/dt is constant (=K). As such voltages whose dV/dt's are constant, a triangular voltage etc. are mentioned besides the ramp voltage as shown in FIG. 7(c).

The orientation state of the liquid crystal molecules changes when a voltage not smaller than a specified threshold value is applied. Therefore, the reading voltage $V_R$ which is applied for detecting the capacitance should preferably have a voltage value less than the threshold value of the liquid crystal.

The current detector circuit 55a-55c converts the aforementioned displacement current i into a voltage, and is composed of an operational amplifier 61 and resistors.

The capacitance discriminator circuit 56a-56c is composed of a comparator 62, and compares the output $V_a$ of the operational amplifier with a reference voltage $V_{ref}$ which serves as the value of the capacitance of the liquid crystal in the initial state.

Here, the output $V_s(t)$ of the operational amplifier 61 becomes $V_W$ for the picture element in the written state and $N_{WN}$ for the picture element in the non-written state as shown in FIG. 7(c). Accordingly, when $V_a$ and $V_{ref}$ are compared by the comparator, the output $D_a$ of the comparator becomes a high level "H" for the written state and a low level "L" for the non-written state.

Owing to this fact, the reference voltage $V_{ref}$ is set to be close to the intermediate value between $N_{NW}$ and $V_W$, and the relation of magnitudes between the reference voltage $V_{ref}$ being the value of the capacitance of the liquid crystal in the initial state and the read voltage $V_s$ being the value of the capacitance of the liquid crystal in the driven state is discriminated, whereby read-out errors attributed to the fluctuations of the distances between the electrodes, the fluctuations of temperatures, etc. are prevented, and the read-out of image information from the liquid crystal panel 20 is permitted.

Figure 8:
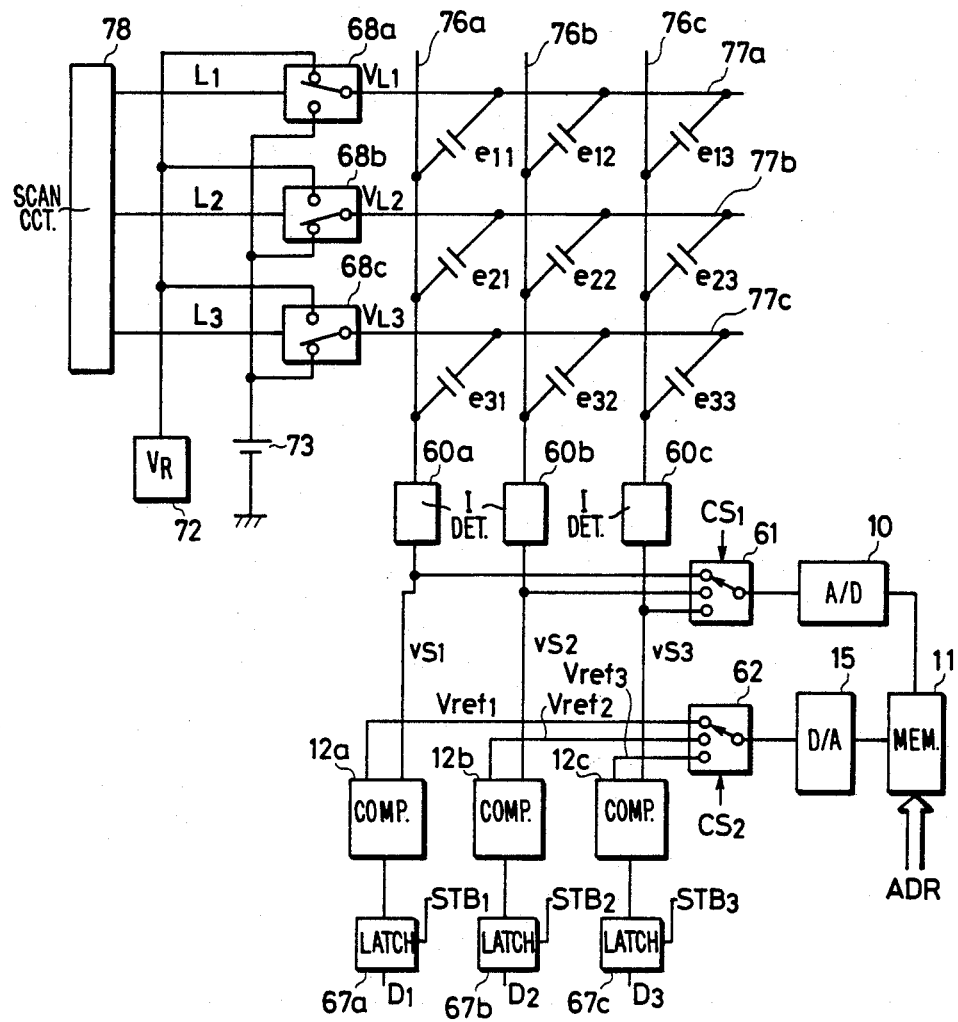
FIG. 8 to FIG. 15 are diagrams showing concrete examples of the reading of image information.

FIG. 8 shows a practicable example of the portions relevant to the read-out of image information in the circuit arrangement shown in FIG. 3.

1-out-of-2 switches 68a-68c are connected to the scanning electrodes 77a-77c of the liquid crystal panel. One side of each 1-out-of-2 switch has the reading voltage $V_R$ applied thereto, while the other side has a D.C. power source 73 connected thereto or is grounded.

Meanwhile, current detector circuits 60a-60c are connected to signal electrodes 76a-76c, and their outputs are applied to a switch 61 and comparators 12a-12c.

The output of the switch 61 is converted by an analog-to-digital converter circuit (hereinbelow, abbreviated to "A/D") 10 into a digital signal of a plurality of bits, which is temporarily stored in a memory circuit 11.

Further, the output of the memory circuit 11 is converted by a digital-to-analog converter circuit (hereinbelow, abbreviated to "D/A") 15 into an analog signal, which is applied to the comparators 12a-12c via a switch 62. The outputs of the comparators 12a-12c are fed into latch circuits 67a-67c at the timings of strobe signals STB1-STB3.

The operation of the circuit arrangement shown in FIG. 8 consists of the first operation of feeding the memory circuit with the capacitances of respective picture elements at the time at which information is not written in the liquid crystal panel, namely, at which the orientation state of liquid crystal molecules is the initial state, and the second operation of comparing the values of the capacitances fed into the memory circuit and the values of the capacitances of the respective picture elements read out on occasion, so as to discriminate the relations of magnitudes.

Figure 9:
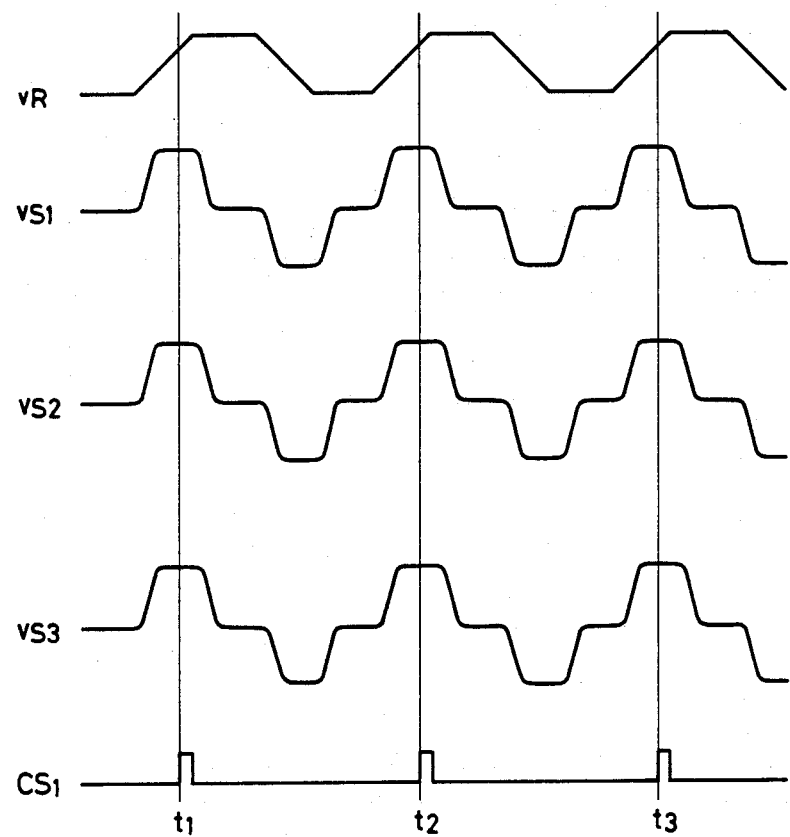

FIG. 9 shows the timings of the first operation mentioned above. When the reading voltage $V_R$ is applied to the scanning electrode 77a by way of example, the saturation values of the output voltages $V_{S1}-V_{S3}$ of the current detector circuits 60a-60c become values corresponding to the capacitances of the respective picture elements $e_{11}$, $e_{12}$ and $e_{13}$.

Then, the switch 61 is successively changed-over by a change-over signal CS1. First, at a time $t_1$, the voltage $V_{S1}$ is sent to the A/D 10, and the signal obtained here is fed into the memory circuit 11.

Next, the voltage $V_{S2}$ is sent to the A/D 10 at a time $t_2$, and the voltage $V_{S3}$ is sent thereto at a time $t_3$. By executing the above operations in succession, the capacitances of all the picture elements can be fed into the memory circuit 11.

Figure 10:
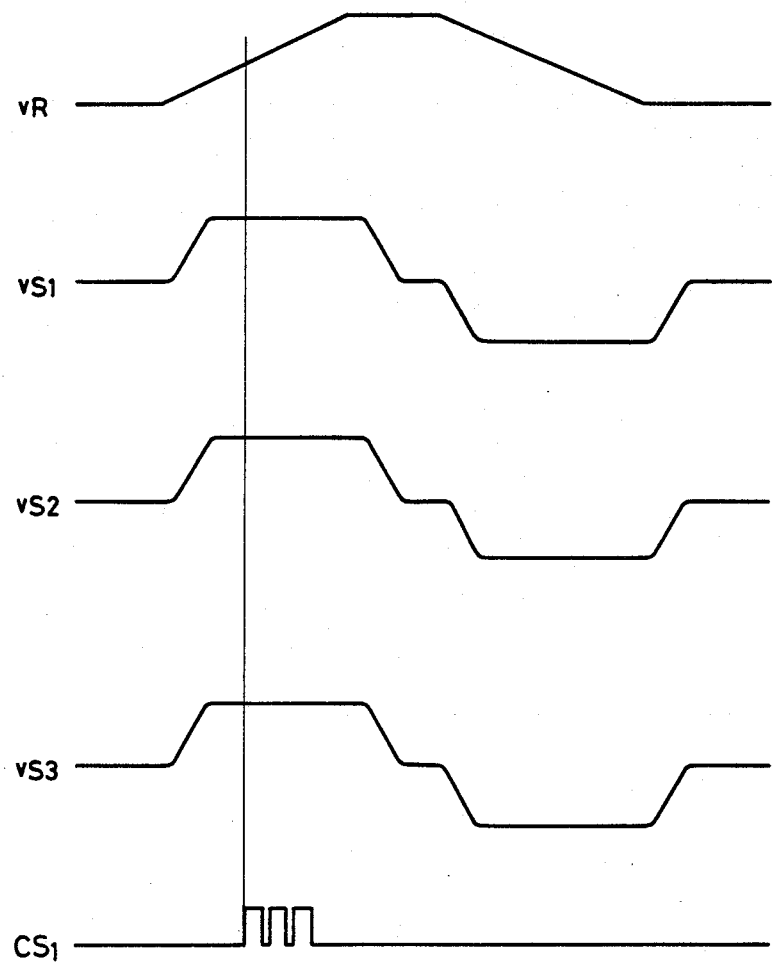

FIG. 10 shows another example of timings. The switch 61 is changed-over within the rise time of the reading voltage $V_R$ so as to send the voltages $V_{S1}-V_{S3}$ to the A/D 10, whereupon the results are fed into the memory circuit 11.

The first operation described above is carried out at the closure of a power supply or at the erasure of the whole panel. The fluctuations of the ambient temperature can also be compensated by executing the first operations periodically.

Figure 11:
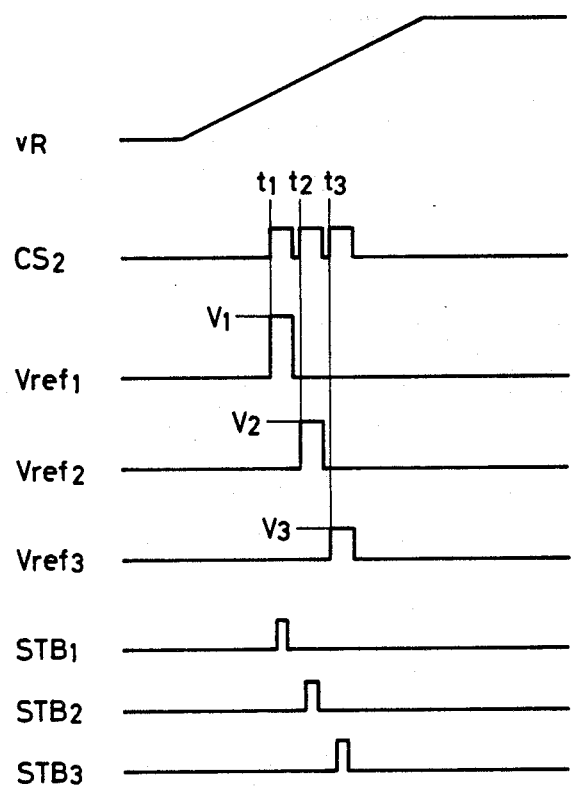

FIG. 11 shows the timings of the second operation. Within the rise time of the reading voltage $V_R$, the contents of the memory circuit 11 are successively sent to the D/A 15, and reference voltages $V_{ref1}$, $V_{ref2}$ and $V_{ref3}$ are respecitvely generated at times $t_1$, $t_2$ and $t_3$, while they are respectively sent to the comparators 12a, 12b and 12c by changing-over the switch 62.

Since, at this time, the output voltages $V_{S1}-V_{S3}$ of the current detector circuits 60a-60c have the values corresponding to the capacitances of the respective picture elements, the states of the picture elements can be read out by comparing the aforementioned voltages $V_{ref1}$, $V_{ref2}$, $V_{ref3}$ and $V_{S1}-V_{S3}$.

Figure 12:
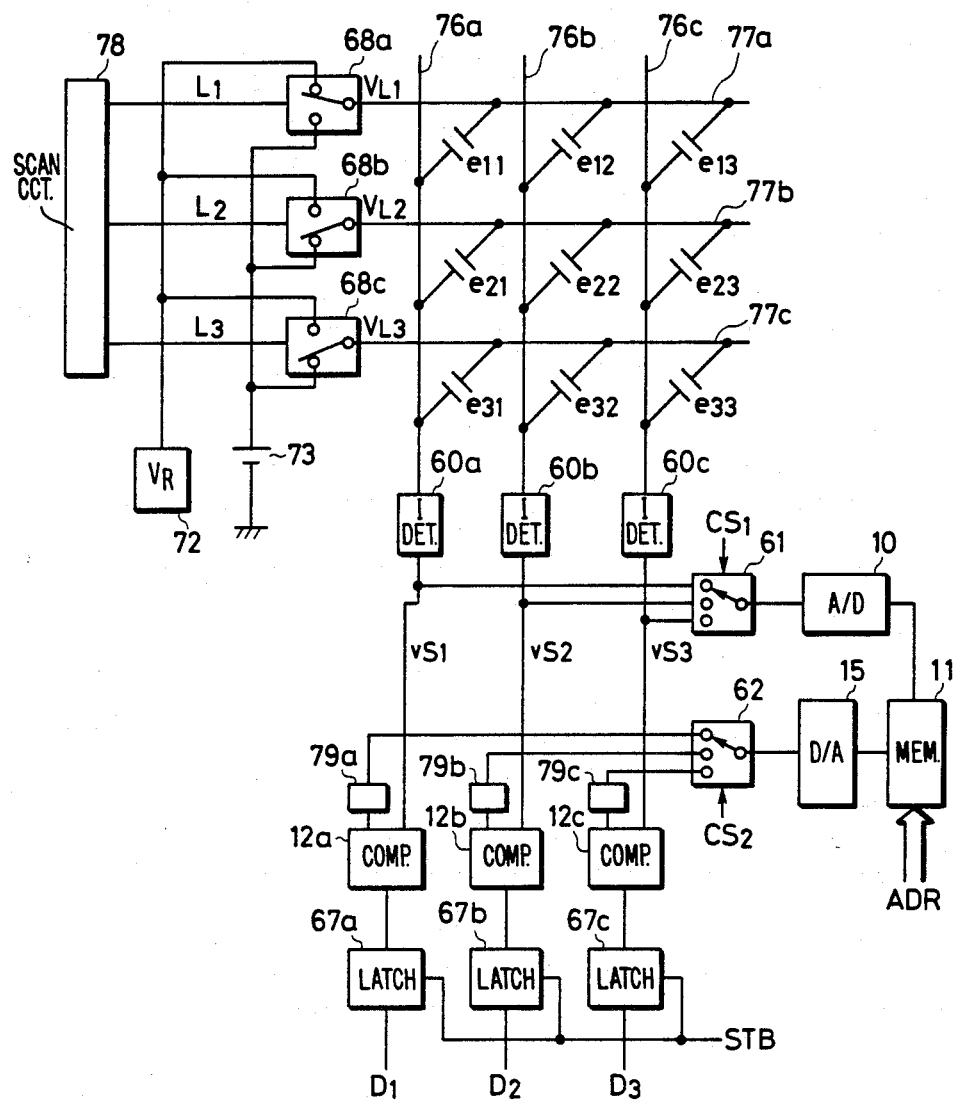

FIG. 12 shows another embodiment of the present invention. This circuit arrangement is characterized in that holding circuits 79a-79c for temporarily holding analog voltages are disposed at the inputs of the comparators 12a-12c, thereby making it possible to deliver the contents of the memory circuit 11 in a short time.

Figure 13:
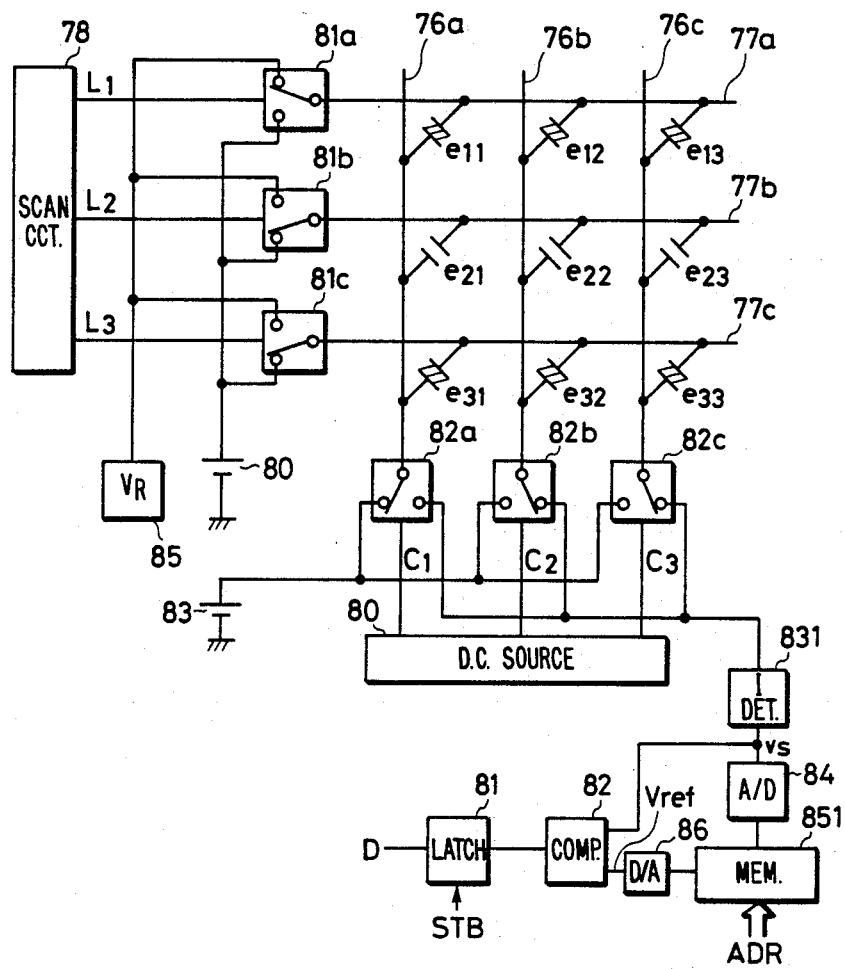

FIG. 13 shows another embodiment for reading out information. 1-out-of-2 switches 81a-81c are connected to scanning electrodes 77a-77c. One side of each switch is connected to a reading voltage generator circuit 85, while the other side is connected to a D.C. power source 80 or is grounded.

Meanwhile, 1-out-of-2 switches 82a-82c are connected to signal electrodes 76a-76c. One side of each of the switches 82a-82c is connected to a D.C. power source 83 or is grounded. Further, the other sides of the switches are connected to a current detector circuit 83' in common.

The output of the current detector circuit 831 is connected to an A/D 84 and a comparator 182. Further, the output of the A/D is applied to a memory circuit 851, the output of which is applied to a D/A 86, the output of which is applied to the comparator 182. The output of this comparator 182 is fed into a latch circuit 81 by a timing signal STB.

The circuit arrangement shown in FIG. 13 executes the first operation and the second operation likewise to the current arrangement shown in FIG. 8.

Figure 14:
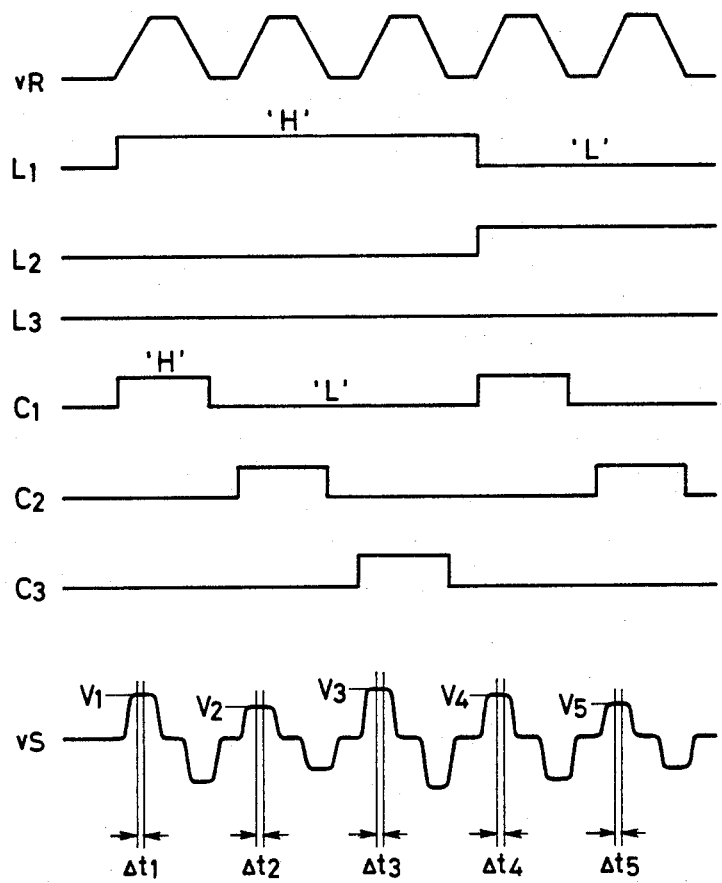

FIG. 14 illustrates the timings of the first operation for feeding the memory circuit 851 with the capacitances of respective picture elements at the time at which no information is written in a liquid crystal panel in FIG. 13, namely, at which the orientation state of liquid crystal molecules is the initial state.

For example, in reading out the capacitances of the picture elements $e_{11}$, $e_{12}$ and $e_{13}$, a horizontal scanning signal $L_1$ is brought to 'H', and the reading voltage $V_R$ is applied to the scanning electrode 77a. Further, vertical scanning signals $C_1$–$C_3$ are successively brought to 'H' so as to successively supply the current detector circuit 831 with currents flowing through the signal electrodes 76a–76c.

As a result, the saturation values of the outputs $V_S$ of the current detector circuit 831 become values corresponding to the capacitances of the respective picture elements. The voltages $V_1$–$V_3$ are converted by the A/D 84 into digital signals, which are stored into the memory circuit 851 in succession. Such operations are performed for all the picture elements.

Figure 15:
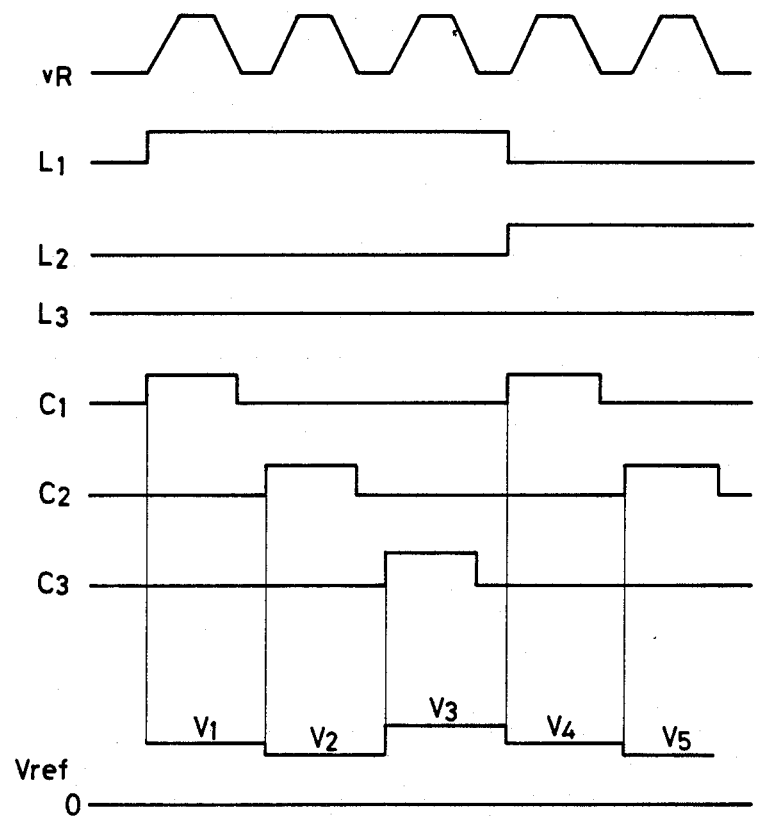

FIG. 15 illustrates the timings of the second operation for comparing the contents of the memory circuit 851 in FIG. 13 and contents read out on occasion.

The timings of the reading voltage $V_R$, horizontal scanning signals $L_1$–$L_3$ and vertical scanning signals $C_1$–$C_3$ are the same as in FIG. 14. As illustrated, the contents of the memory circuit 851 are successively read out at the timings of the vertical scanning signals $C_1$–$C_3$. As a result, the outputs $V_{ref}$ of the D/A 86 become $V_1$, $V_2$, $V_3$....

When the capacitances of all the picture elements of the liquid crystal panel are fed into the memory circuit 851, the memory capacity becomes large particularly in case of a large-sized panel. Therefore, a system is considered wherein with note taken of the fact that the inter-electrode distance d of the liquid crystal panel does not suddenly fluctuate in an opposite portion of small area, an opposite portion forming a matrix of M rows and N columns is divided into k ($1 \leq k < M \times N$) blocks, and the capacitances of opposite portions, one being selected from each block, are held in a memory circuit 11 at least temporarily. Such an example is shown in FIG. 16.

Figure 16:
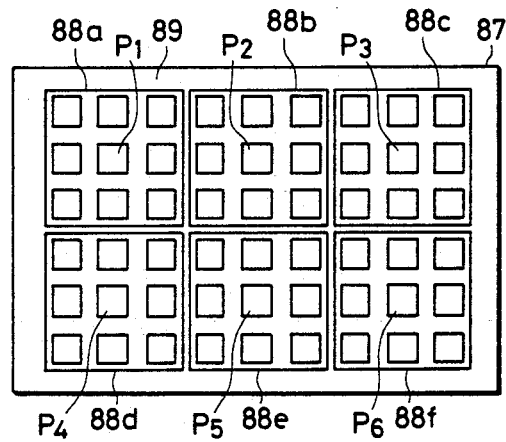

In FIG. 16, the picture elements of a liquid crystal panel 87 forming a matrix of 6 rows and 9 columns are divided into six blocks 88a–88f, and the capacitances of the picture elements P1–P6 are fed into the memory circuit 11.

For example, in case of reading out the information of the picture elements of the block 88a, the capacitance of the picture element P1 located substantially at the center of the block 88a is taken as a reference.

Figure 17:
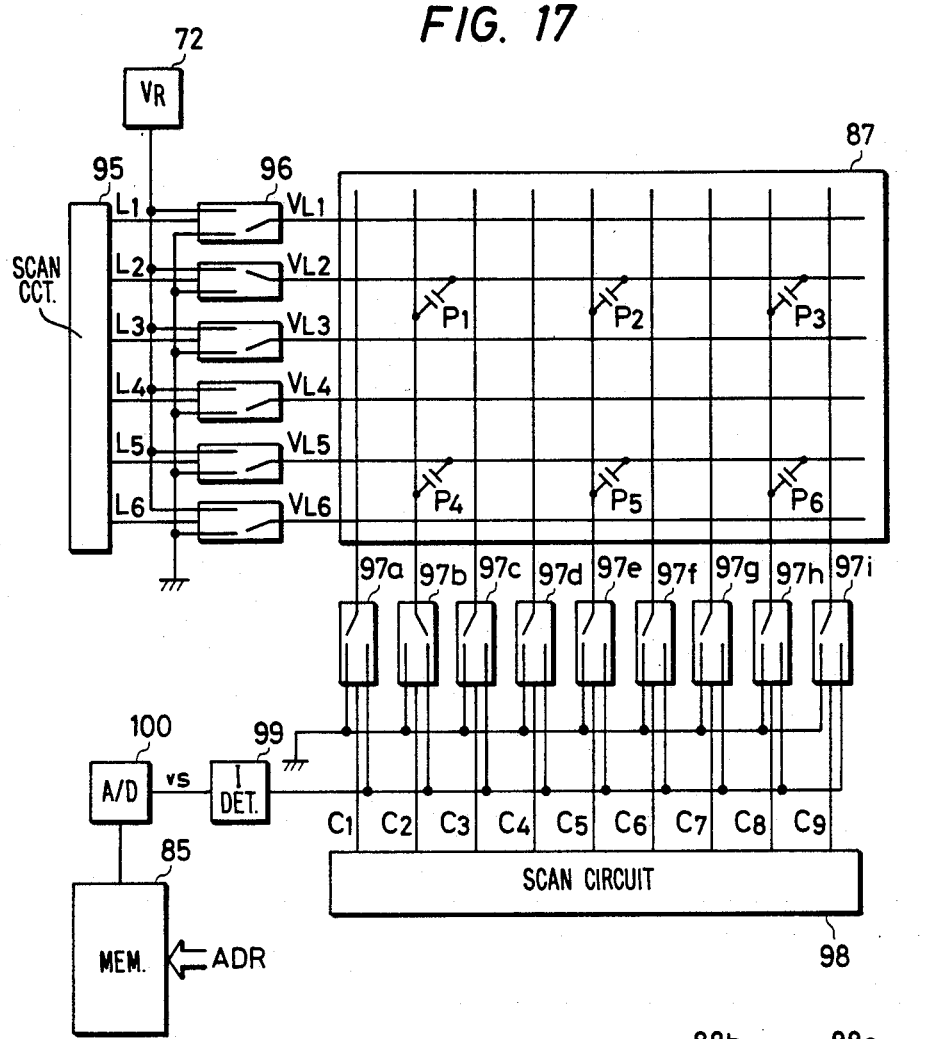
FIG. 16 to FIG. 19 are diagrams showing examples of the division of picture elements which form other embodiments of the present invention.

FIG. 17 shows a circuit arrangement at the time at which the values of the capacitances of the picture elements shown in FIG. 16 are read out and are applied to a memory circuit 85. Here will be explained a case of reading out the capacitances of the picture elements P1, P2 and P3. The other picture elements are omitted from the drawing.

Figure 18:
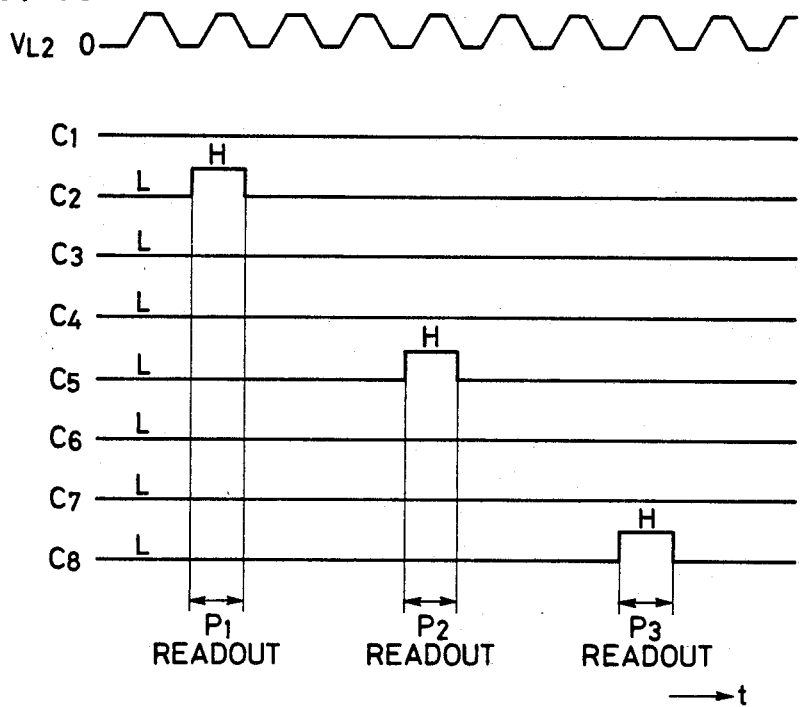

FIG. 18 illustrates an operating example in the case of reading out the picture elements P1–P3. Using vertical scanning signals L1–L6 from a vertical scanning circuit 95, only the scanning electrode of the second line L2 is supplied with the reading voltage $V_R$, and the other scanning electrodes are brought to the zero level.

Meanwhile, among horizontal scanning signals $C_1$–$C_9$ from a horizontal scanning circuit 98, only those $C_2$, $C_5$ and $C_8$ are brought to an 'H' level in succession, whereby currents flowing through the respective picture elements P1–P3 are applied to a current detector circuit 99 via 1-out-of-2 switches 97b, 97e and 97h.

Further, detection voltages $V_S$ provided from the current detector circuit 99 are applied to an analog-to-digital converter circuit 100, and digital signals produced here are stored into the memory circuit 85 in succession.

Figure 19:
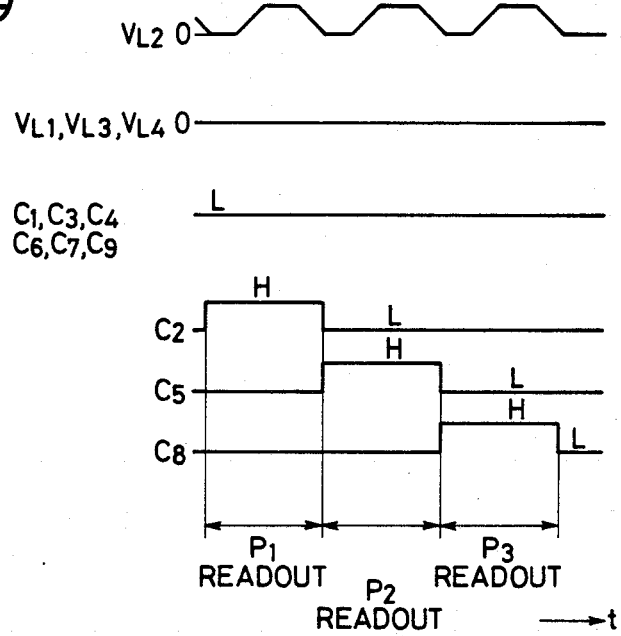

FIG. 19 shows another operating example for reading out the capacitances of the picture elements P1, P2 and P3. Here, the reading voltage for 3 clocks is applied to the scanning electrode of the second line L2, and the scanning signals C2, C5 and C8 are brought to the 'H' level in continuous fashion, whereby the currents flowing through the picture elements P1, P2 and P3 are applied to the current detector circuit 99 via the 1-out-of-2 switches 97b, 97e and 97h.

Figure 20:
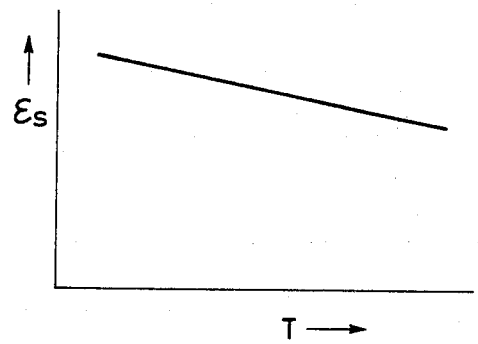
FIG. 20 is a diagram of the temperature characteristic of the relative permittivity of a liquid crystal.

FIG. 20 shows the temperature characteristic of the relative permittivity $\epsilon_S$ of the liquid crystal having the smectic phase. The relative permittivity $\epsilon_S$ has a minus temperature coefficient. For this reason, the saturation value of the output $V_S$ of the current detector circuit fluctuates depending upon temperatures, to give rise to a read-out error.

Figure 21:
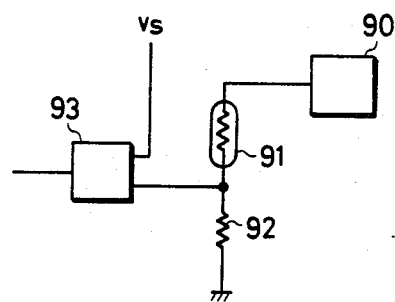
FIG. 21 is a diagram showing an embodiment in the case of employing a temperature compensation circuit.

In this regard, the problem can be solved in such a way that, as shown in FIG. 21, the output voltage of a D/A 90 is divided by a temperature sensor element, e.g., thermistor 91 and a resistor 92, whereupon the resulting voltage is applied to a comparator 93.

Further, the read-out error attributed to the temperature fluctuation can be prevented by periodically performing the first operation described before.

In the present embodiment, when a gain adjusting circuit is added to the output of the D/A, the absolute value of a reference voltage can be controlled at will, and a flexible device can be provided.

In the present embodiment, the liquid crystal having the smectic phase has been explained as an example. As stated before, however, the present invention is applicable to any dielectric, such as a liquid crystal having a cholesteric phase or PLZT, the capacitance of which is changed by applying an electric field, heat or the like and is further stored without changing for a fixed period of time even after removing the electric field, the heat or the like.

Means for changing the capacitance of the dielectric is not restricted to heating means, but it may be any means adapted to change the capacitance of the dielectric, such as electric field means or current means.

As an expedient for detecting the capacitance, besides the method thus far described wherein the reading voltage changing with time is applied so as to detect the displacement current, there is, for example, a method wherein as disclosed in U.S. patent application Ser. No. 521900 (corresponding to European Patent Application No. 83107895.1), current is caused to flow through a picture element so as to detect the change of an impedance.

As set forth above, read-out errors can be prevented against fluctuations in the distance d between electrodes and in temperatures, and hence, an information input/output display device of high reliability can be provided.

What is claimed is:

1. An information input/output display device comprising a dielectric which is held between one electrode and another electrode positioned opposite to each other and which has at least a first state and a second state of unequal capacitances, means for changing the state of said dielectric between said first and second states to change the capacitance of said dielectric, means for detecting the capacitance of said dielectric and for producing a signal indicative of the value thereof, capacitance value holding means for holdng at least temporarily the signal produced by said detecting means representing a value of the capacitance of said dielectric in the first or the second state, and means for comparing the signal produced by said detecting means representing a present value of the capacitance of said dielectric with the signal held by said holding means representing a previous value of the capacitance of that dielectric and for producing an output signal representing the result of said comparison.

2. An information input/output display device according to claim 1, wherein said dielectric is a dielectric whose capacitance is changed upon application thereto of an outside stimulus and whose capacitance is retained without change for a fixed period of time after the removal of the outside stimulus.

3. An information input/output display device according to claim 2, wherein said dielectric is a liquid crystal having a smectic phase.

4. An information input/output display device according to claim 1, wherein said means for changing the state of the dielectric to change the capacitance thereof comprises means to heat said dielectric.

5. An information input/output display device according to claim 1, wherein said means for detecting the capacitance of said dielectric is composed of means for applying a voltage changing with time to said dielectric, and means for detecting a displacement current flowing through said dielectric.

6. An information input/output display device according to claim 5, wherein the voltage changing with time is a voltage whose dV/dt is constant.

7. An information input/output display device according to claim 5, wherein the voltage changing with time is a voltage of such a magnitude that the capacitance of said dielectric is relatively unchanged.

8. An information input/output display device comprising a dielectric which is held between a plurality of electrodes on one side and a plurality of electrodes on the other side opposite to one another so as to form a matrix of M rows and N columns divided into k (1<k<M×N) blocks, and said dielectric having at least a first state and a second state of unequal capacitances, means for changing the capacitance of said dielectric at any desired location, means for detecting the capacitance of said dielectric in the desired location, capacitance value holding means for holding at least temporarily a value of the capacitance of said dielectric in the first or second state held in any desired location included in each block of said matrix, and means for comparing a present value of the capacitance of said dielectric in the desired location with a previous value of the capacitance as held by said capacitance value holding means corresponding to the block of said dielectric in said desired location.

9. An information input/output display device according to claim 8, wherein said dielectric is a dielectric whose capacitance is changed by applying an outside stimulus and is retained without changing for a fixed period of time even after the removal of the outside stimulus.

10. An information input/output display device according to claim 9, wherein said dielectric is a liquid crystal having a smectic phase.

11. An information input/output display device according to claim 8, wherein said means for changing the capacitance of said dielectric comprises means to heat said dielectric.

12. An information input/output display device according to claim 8, wherein said means for detecting the capacitance of said dielectric is composed of means to apply a voltage changing with time to said dielectric, and means to detect a displacement current flowing through said dielectric.

13. An information input/output display device according to claim 12, wherein the voltage changing with time is a voltage whose dV/dt is constant.

14. An information input/output display device according to claim 12, wherein the voltage changing with time is a voltage of such a magnitude that the capacitance of said dielectric is relatively unchanged.

15. An information input/output display device according to claim 8, wherein said means for detecting the capacitances of said dielectric in any desired location comprises means for simultaneously detecting the capacitances of the dielectric at locations of the electrodes on one side and the electrodes on the other side of the dielectric corresponding to at least two rows of the matrix.

16. An information input/output display device according to claim 8, wherein said capacitance value holding means includes a plurality of addressable storage locations each capable of storing a signal representing a capacitance value for a respective one of said blocks of said matrix.

* * * * *